(12) United States Patent
Bal et al.

(10) Patent No.: US 12,009,830 B2
(45) Date of Patent: *Jun. 11, 2024

(54) TIMING SKEW MISMATCH CALIBRATION FOR TIME INTERLEAVED ANALOG TO DIGITAL CONVERTERS

(71) Applicant: STMicroelectronics International N.V., Geneva (CH)

(72) Inventors: Ankur Bal, Greater Noida (IN); Vikram Singh, Radaur (IN)

(73) Assignee: STMicroelectronics International N.V., Geneva (CH)

(*) Notice: Subject to any disclaimer, the term of this patent is extended or adjusted under 35 U.S.C. 154(b) by 0 days.

This patent is subject to a terminal disclaimer.

(21) Appl. No.: 18/075,977

(22) Filed: Dec. 6, 2022

(65) Prior Publication Data

US 2023/0101518 A1 Mar. 30, 2023

Related U.S. Application Data

(63) Continuation of application No. 17/354,126, filed on Jun. 22, 2021, now Pat. No. 11,552,646.

(Continued)

(51) Int. Cl.
*H03M 1/10* (2006.01)
*H03M 1/06* (2006.01)
(Continued)

(52) U.S. Cl.
CPC ....... *H03M 1/1023* (2013.01); *H03M 1/0624* (2013.01); *H03M 1/0836* (2013.01); *H03M 1/1215* (2013.01)

(58) Field of Classification Search
CPC ............ H03M 1/1023; H03M 1/0624; H03M 1/0836; H03M 1/1215
(Continued)

(56) References Cited

U.S. PATENT DOCUMENTS 7,227,479 B1 6/2007 Chen et al.
8,102,289 B2 1/2012 Oshima et al.
(Continued)

OTHER PUBLICATIONS

Armia Salib, Mark F. Flanagan and Barry Cardiff, "A High-Precision Time-Skew Estimation and Correction Technique for Time-Interleaved ADCs", IEEE Transactions on Circuits and Systems I: Regular Papers, 1 O Oct. 2019.
(Continued)

*Primary Examiner* — Khai M Nguyen
(74) *Attorney, Agent, or Firm* — Crowe & Dunlevy LLC

(57) ABSTRACT

A time-interleaved analog to digital converter (TI-ADC) includes a first sub-ADC configured to sample and convert an input analog signal to generate a first digital signal and a second sub-ADC configured to sample and convert said input analog signal to generate a second digital signal. Sampling by the second sub-ADC occurs with a time skew mismatch. A multiplexor interleaves the first and second digital signals to generate a third digital signal. A time skew mismatch error determination circuit processes the first and second digital signals to generate a time error corresponding to the time skew mismatch. A slope value of said third digital signal is determined and multiplied by the time error to generate a signal error. The signal error is summed with the third digital signal to generate a digital output signal which eliminates the error due to the time skew mismatch. This correction is performed in real time.

22 Claims, 7 Drawing Sheets

Related U.S. Application Data

(60) Provisional application No. 63/043,433, filed on Jun. 24, 2020.

(51) Int. Cl.
 *H03M 1/08* (2006.01)
 *H03M 1/12* (2006.01)

(58) Field of Classification Search
 USPC .......................................... 341/118, 120, 155
 See application file for complete search history.

(56) References Cited

U.S. PATENT DOCUMENTS

| | | | |
|---|---|---|---|
| 8,890,728 | B2 | 11/2014 | Le Dortz et al. |
| 9,088,293 | B1 | 7/2015 | D'Souza et al. |
| 9,154,147 | B2 * | 10/2015 | Biallais ............... H03M 1/0607 |
| 9,270,291 | B1 | 2/2016 | Parnaby et al. |
| 9,287,889 | B2 | 3/2016 | Chiu et al. |
| 9,294,112 | B1 * | 3/2016 | Devarajan ........... H03M 1/0836 |
| 9,401,726 | B2 | 7/2016 | Ragab et al. |
| 9,608,652 | B2 | 3/2017 | Lee et al. |
| 2017/0117914 | A1 | 4/2017 | Choi |

OTHER PUBLICATIONS

Armia Salib, Mark F. Flanagan and Barry Cardiff, "Time-Skew Estimation for Random Sampling Sequence Time-Interleaved ADCs", IEEE Transactions on Circuits and Systems II: Express Briefs, 2019.

Behzad Razavi, "Design Considerations for Interleaved ADCs", IEEE Journal of Solid-State Circuits, Aug. 2013.

C.-C. Huang, C.-Y. Wang, and J.-T. Wu, "A CMOS 6-bit 16-GS/s time-interleaved ADC using digital background calibration techniques," IEEE Journal of Solid-State Circuits, Apr. 2011.

C.-Y. Wang and J.-T. Wu, "A background timing-skew calibration technique for time-interleaved analog-to-digital converters," IEEE Trasn. Circuits Syst. II, Apr. 2006.

Chin-Yu Lin, Yen-Hsin Wei, Tai-Cheng Lee, "A 10b 2.6GS/s Time-Interleaved SAR ADC with Background Timing-Skew Calibration", ISSCC 2016.

D. Stepanovic and B. Nikolic, "A 2.8-GS/s 44.6-mW time-interleaved ADC achieving 50.9 SNDR and 3-dB effective resolution bandwidth of 1.5 GHZ in 65-nm CMOS," Proc. Symp. VLSI Circuits Dig. Tech. Papers, Jun. 2012.

Duan Y, Alon E, "A 12.8 Gs/s time-interleaved adc with 25 GHz effective resolution bandwidth and 4.6 enob," IEEE Journal of Solid-State Circuits, 2014.

Science, vol. 65, No. 12, Dec. 2018 Lei Zhao, Zouyi Jiang, Ruoshi Dong, Zhe Cao, Xingshun Gao, Boyu Cheng, Jiadong Hu, Shubin Liu, and Qi An, "An 8-Gs/s 12-Bit TIADC System With Real-Time Broadband Mismatch Error Correction", IEEE Transactions on Nuclear.

M. El-Chammas and B. Murmann, "A 12-GS/s 81-mW 5-bit time-interleaved flash ADC with background timing skew calibration," IEEE Journal of Solid-State Circuits, Apr. 2011.

Nicolas Le Dortz, Jean-Pierre Blanc, Thierry Simon, Sarah Verhaeren, et al., "A 1.62GS/s Time-Interleaved SAR ADC with Digital Background Mismatch Calibration Achieving Interleaving Spurs Below 70dBFS", ISSCC 2014.

S. M. Jamal et al., "A 10-b 120-Msample/s time-interleaved analog-todigital converter with digital background calibration," IEEE Journal of Solid-State Circuits, Dec. 2002.

Seo M, Rodwell M J W, Madhow U, "A low computation adaptive blind mismatch correction for time-interleaved ADCs," Circuits and Systems, 2006.

Wang, Xiao, Fule Li, and Zhihua Wang. "A novel autocorrelation-based timing mismatch C alibration strategy in Time-☐ Interleaved ADCs." Circuits and Systems (ISCAS), IEEE International Symposium, 2016.

Yongtao Qiu, Jie Zhou, Youjiang Liu, Guifu Zhang , Yinong Liu, "Novel adaptive blind calibration technique of time-skew mismatches for any channel timeinterleaved analogue-to-digital converters", IET Circuits, Devices & Systems, Aug. 2019.

Zouyi Jiang.Lei Zhao, Xingshun Gao, Ruoshi Dong, Jinxin Liu, and Qi An, "Mismatch error correction for time interleaved analog-to-digital converter over a wide frequency range", Review of Scientific Instruments, Aug. 2018.

\* cited by examiner $$H_p(z) = \begin{bmatrix} h\left(\frac{M}{2}-m\right) & h\left(\frac{M}{2}-m+\frac{r}{M}\right) & \cdots & h\left(\frac{M}{2}-m+r-M\right) \\ \vdots & \vdots & \vdots & \vdots \\ h\left(\frac{M}{2}-1\right) & h\left(\frac{M}{2}-1+\frac{r}{M}\right) & \cdots & h\left(\frac{M}{2}-1+r-M\right) \\ h\left(\frac{M}{2}\right) & h\left(\frac{M}{2}+\frac{r}{M}\right) & \cdots & h\left(\frac{M}{2}+r-M\right) \\ h\left(\frac{M}{2}+1\right) & h\left(\frac{M}{2}+1+\frac{r}{M}\right) & \cdots & h\left(\frac{M}{2}+1+r-M\right) \\ \vdots & \vdots & \vdots & \vdots \\ h\left(\frac{M}{2}+m\right) & h\left(\frac{M}{2}+m+\frac{r}{M}\right) & \cdots & h\left(\frac{M}{2}+m+r-M\right) \end{bmatrix} \begin{bmatrix} 1 \\ Z^{-1} \\ Z^{-2} \\ Z^{-3} \\ Z^{-4} \\ \vdots \\ \vdots \\ Z^{-\left(\frac{r}{M}-1\right)} \end{bmatrix}$$

FIG. 14

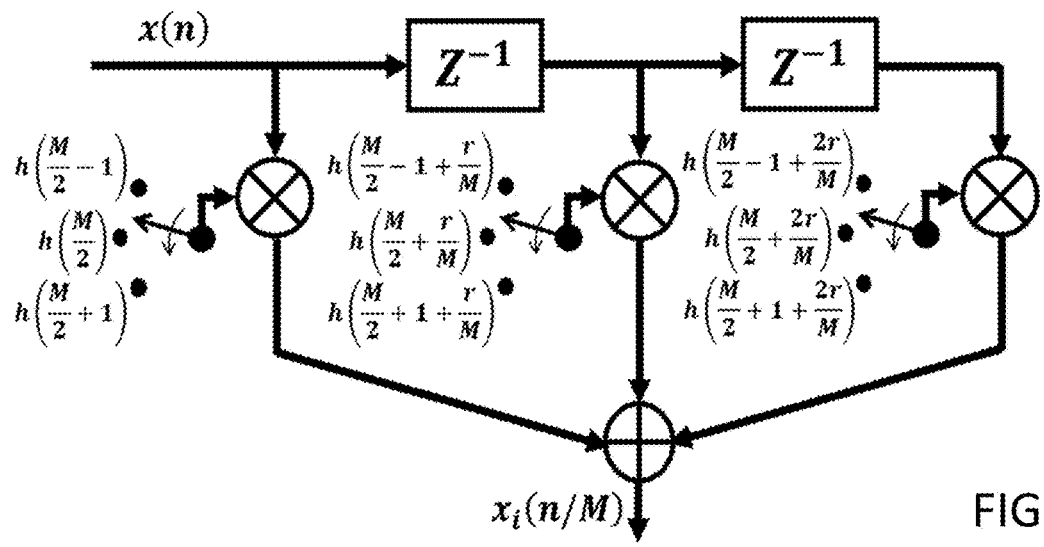

FIG. 15

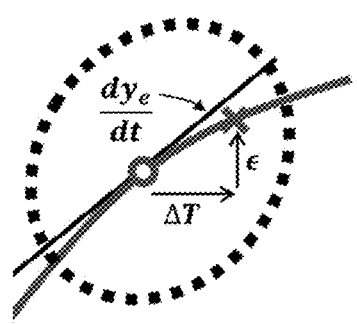

FIG. 16

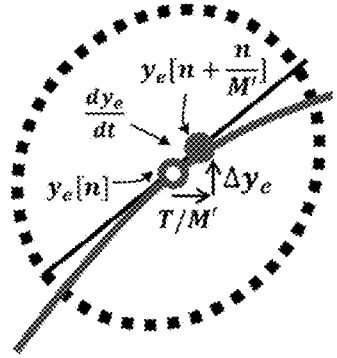

FIG. 17

$$H_d(z) = \begin{bmatrix} h(0) & h\left(\frac{r'}{M'}\right) & h\left(\frac{2r'}{M'}\right) & \cdots & h(r'-M') \end{bmatrix} \begin{bmatrix} 1 \\ Z^{-1} \\ Z^{-2} \\ \vdots \\ \vdots \\ Z^{-\left(\frac{r'}{M'}-1\right)} \end{bmatrix}$$
FIG. 18
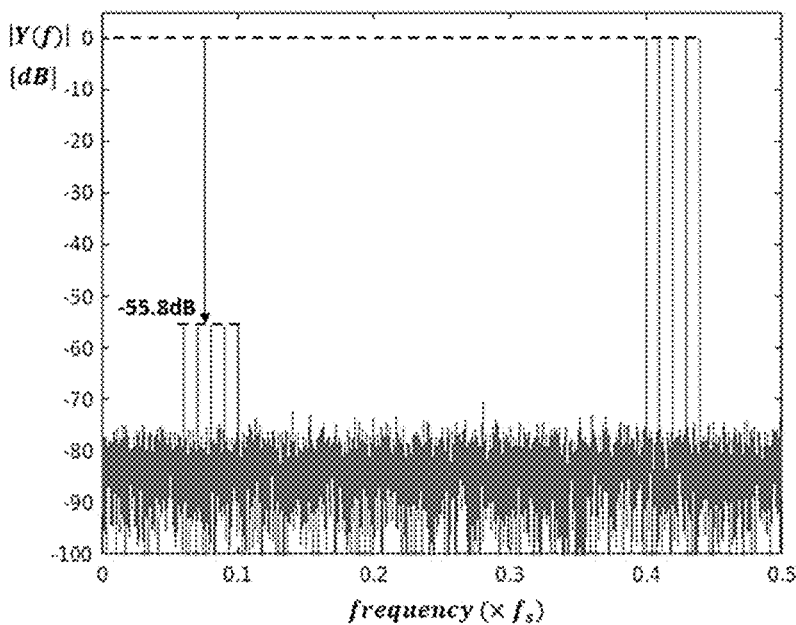
FIG. 19
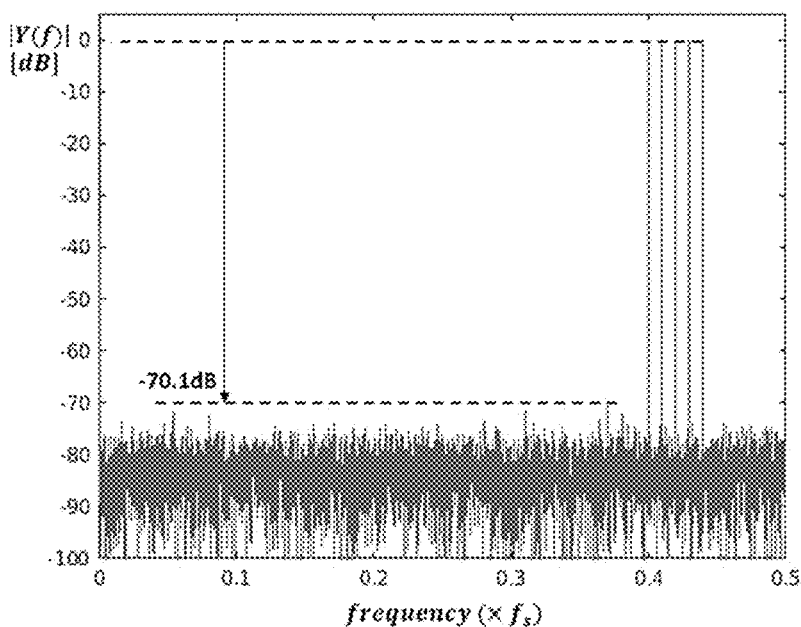
FIG. 20

TIMING SKEW MISMATCH CALIBRATION FOR TIME INTERLEAVED ANALOG TO DIGITAL CONVERTERS

CROSS-REFERENCE TO RELATED APPLICATION

This application is a continuation of U.S. patent application Ser. No. 17/354,126, filed Jun. 22, 2021, which claims priority from United States Provisional Application for Patent No. 63/043,433, filed Jun. 24, 2020, the disclosures of which are incorporated by reference.

TECHNICAL FIELD

The present invention generally relates to time interleaved analog to digital converters (TI-ADCs) and, in particular, to a calibration process and circuit configured to address timing skew mismatch.

BACKGROUND

An analog to digital converter (ADC) circuit is a commonly used circuit in many applications where a signal must be converted from the analog domain to the digital domain. It is recognized that certain applications require higher sampling speeds for the conversion process. For example, high-resolution and high-speed analog to digital conversion is essential in broadband communications systems. Such higher sampling speeds, for example at a sampling rate Fs, can be efficiently achieved by interleaving N ADC circuits and having each of the N ADC circuits sample at a sampling rate of $f_s$=Fs/N. The outputs of the N ADC circuits are then time interleaved to produce a cumulative output.

FIG. 1 shows a block diagram of a time interleaved analog to digital converter (TI-ADC) circuit 10. The circuit 10 includes N analog to digital (ADC) converters 12(1)-12(N) (also referred to in the art as sub-ADCs). The analog input signal 14 to be converted to the digital domain is applied to N sample and hold (S/H) circuits 16(1)-16(N). Each sample and hold circuit 16 is receives a corresponding sampling clock 18(1)-18(N), and the sampling clocks 18 each have a sampling frequency of $f_s$ but are uniformly phase offset from each other across a clock period T; for example, with a phase offset of T/N (see, FIG. 2). Each ADC converter 12 operates to convert the sampled analog signal 20 produced by the S/H circuit 16 to generate an L-bit digital signal 22. A selector circuit 24, also referred to in the art as a multiplexor, operating at the rate Fs, sequentially selects the L-bit digital signals 22(1)-22(N) for interleaving samples of the L-bit digital signals 22 to generate the cumulative digital output signal 26 (see, FIG. 2).

Assuming that the ADC converters 12 are perfectly matched and the sampling clocks 18 are perfectly phase offset, the TI-ADC circuit 10 operates seamlessly like a single high-speed analog to digital converter circuit at the sampling rate Fs. In practice, however, there exists a mismatch in offset, gain, bandwidth and/or sample timing. Such mismatches cause conversion errors and introduce spurs in the cumulative digital output signal 26. Of particular interest is the mismatch in timing (phase offset) for the sampling clocks 18 which is referred to in the art as a timing skew mismatch. Unlike static errors of gain and offset that can be estimated and corrected in the analog or digital domain, timing skew errors in high speed ADCs are of the order of sub-pico seconds and are hard to correct. Worse still, the skew-related errors are caused by misalignment of sampling clock for the sub-ADCs, which generates spurs proportional to the frequency of input signals and hence become a primary concern in implementing a high-speed TI-ADC.

The prior art teaches timing-skew calibration algorithms for interleaved ADCs to correct timing error in both the analog domain and the digital domain. The drawbacks of analog correction include a feedback-induced stability hazard and jitter introduced by a controlled delay line. Digital-domain correction takes advantage of technology scaling but the complex time-skew estimation and slope-extraction filter limits signal bandwidth. Reported convergence time is over 50,000 cycles for contemporary hardware intensive statistical methods and this places undesirable constraints on input signal type and bandwidth.

There is accordingly a need in the art for an improved technique to calibrate the time skew mismatches in the TI-ADC circuit and correct for errors introduced by the time skew mismatches.

SUMMARY

In an embodiment, a time-interleaved analog to digital converter (TI-ADC) comprises: a first sub-ADC configured to sample and convert an input analog signal to generate a first digital signal; a second sub-ADC configured to sample and convert said input analog signal to generate a second digital signal, wherein sampling by said second sub-ADC occurs with a time skew mismatch; a multiplexor configured to interleave the first and second digital signals to generate a third digital signal; a time skew mismatch error (TSME) determination circuit configured to process the first and second digital signals to generate a time error corresponding to said time skew mismatch; a slope extraction circuit configured to process the third digital signal to determine a slope value of said third digital signal; a multiplication circuit configured to multiply the time error by the slope value to generate a signal error; and a summation circuit configured to sum the signal error with the third digital signal to generate a digital output signal.

In an embodiment, a time-interleaved analog to digital converter (TI-ADC) comprises: a first sub-ADC configured to sample and convert an input analog signal to generate a first digital signal; a second sub-ADC configured to sample and convert said input analog signal to generate a second digital signal, wherein sampling by said second sub-ADC occurs with a first time skew mismatch; a third sub-ADC configured to sample and convert said input analog signal to generate a third digital signal, wherein sampling by said third sub-ADC occurs with a second time skew mismatch; a first multiplexor configured to interleave the first, second and third digital signals to generate a fourth digital signal; a first time skew mismatch error (TSME) determination circuit configured to process the first and second digital signals to generate a first time error corresponding to said first time skew mismatch; a second TSME determination circuit configured to process the first and third digital signals to generate a second time error corresponding to said second time skew mismatch; a second multiplexor configured to interleave the first and second time errors generate a time error signal; a slope extraction circuit configured to process the third digital signal to determine a slope value of said third digital signal; a multiplication circuit configured to multiply the time error signal by the slope value to generate a signal error; and a summation circuit configured to sum the signal error with the fourth digital signal to generate a digital output signal.

In an embodiment, a method for time-interleaved analog to digital conversion, comprises: sampling and converting an input analog signal to generate a first digital signal; sampling and converting said input analog signal to generate a second digital signal, wherein sampling by said second sub-ADC occurs with a time skew mismatch; interleaved selecting of the first and second digital signals to generate a third digital signal; determining from the first and second digital signals a time error corresponding to said time skew mismatch; processing the third digital signal to determine a slope value of said third digital signal; multiplying the time error by the slope value to generate a signal error; and summing the signal error with the third digital signal to generate a digital output signal.

In an embodiment, a time-interleaved analog to digital converter (TI-ADC) comprises: a first sub-ADC configured to sample and convert an input analog signal to generate a first digital signal; a second sub-ADC configured to sample and convert said input analog signal to generate a second digital signal, wherein sampling by said second sub-ADC occurs with a time skew mismatch; a multiplexor configured to interleave the first and second digital signals to generate a third digital signal; a processing circuit configured to generate from the first and second digital signals an error signal that estimates an error due to the time skew mismatch; and a summation circuit configured to sum the error signal with the third digital signal to generate a digital output signal.

In an embodiment, a method for time-interleaved analog to digital conversion comprises: sampling and converting an input analog signal to generate a first digital signal; sampling and converting said input analog signal to generate a second digital signal, wherein sampling by said second sub-ADC occurs with a time skew mismatch; interleaved selecting of the first and second digital signals to generate a third digital signal; processing the first and second digital signals to generate an error signal that estimates an error due to the time skew mismatch; and summing the error signal with the third digital signal to generate a digital output signal.

BRIEF DESCRIPTION OF THE DRAWINGS

For a better understanding of the embodiments, reference will now be made by way of example only to the accompanying figures in which:

FIG. 14 illustrates a matrix operation for deriving the polyphase banks;

FIG. 15 illustrates a three bank implementation of a polyphase filter;

FIG. 16 illustrates the erroneous TI-ADC output described by a first order error model;

FIG. 17 illustrates slope extraction for the erroneous TI-ADC output;

FIG. 18 illustrates a matrix operation for deriving a polyphase bank filter;

FIGS. 19-20 show spectra for TI-ADC circuit output without and with, respectively, time skew mismatch error correction;

DETAILED DESCRIPTION

Figure 1:
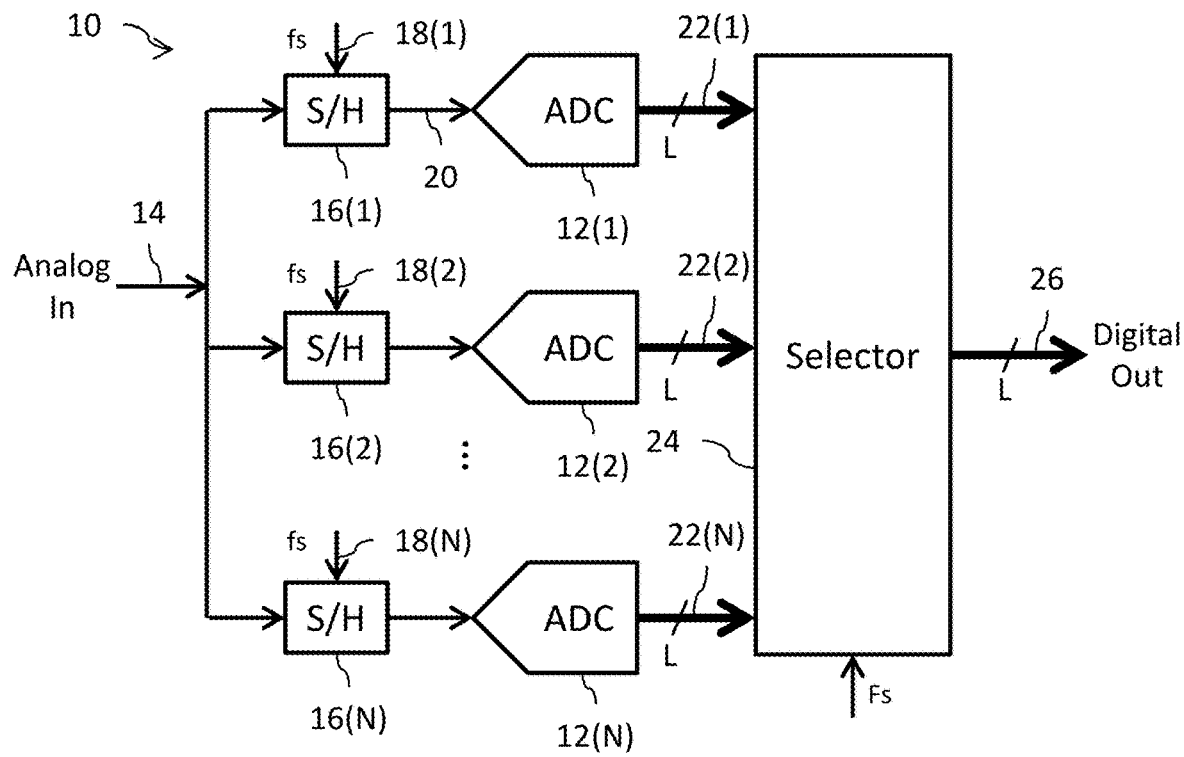
FIG. 1 is a block diagram of a time interleaved analog to digital converter (TI-ADC) circuit.
Figure 2:
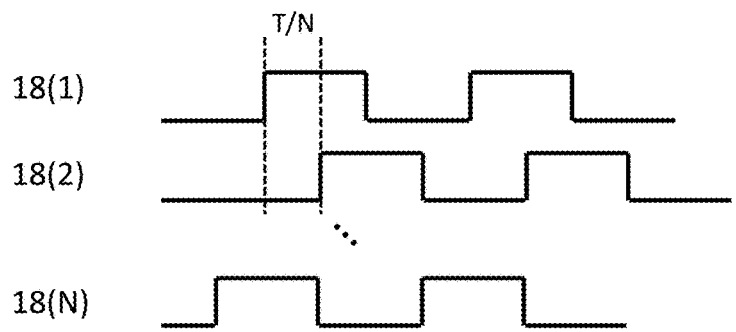
FIG. 2 shows a timing diagram for operation of the TI-ADC circuit of FIG. 1.
Figure 3:
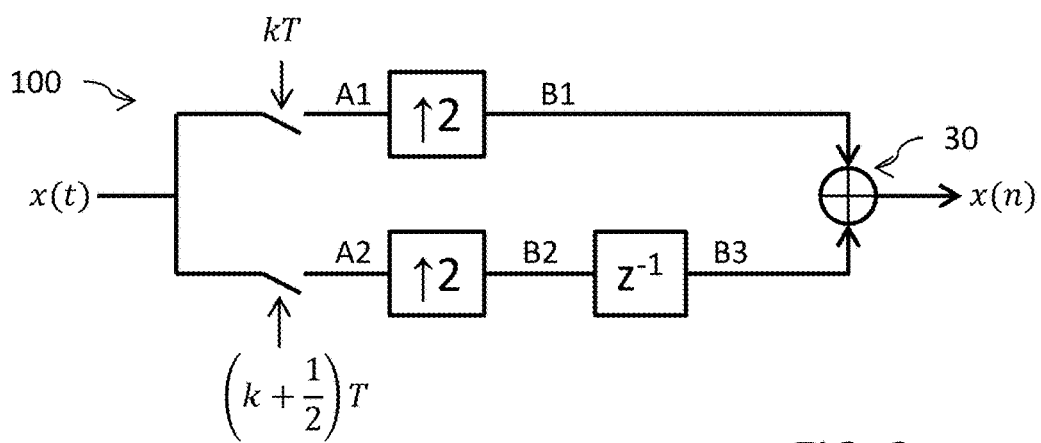
FIG. 3 shows a model of a TI-ADC circuit.
Figure 4:
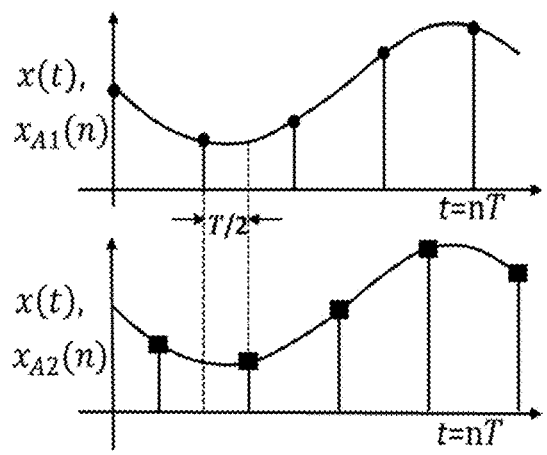
FIG. 4 illustrates the sampled waveform for the model of FIG. 3.

Reference is made to FIG. 3 showing a model 100 of a time interleaved analog to digital converter (TI-ADC) circuit 10 as shown in FIG. 1 where N=2. The selection of N=2 is made by way of a simplified example, but it will be understood that the following description is extendable by one skilled in the art to any suitable integer value of N. Two analog to digital converters 12 with sample and hold circuits 16 each operate at the sampling rate $f_s$. The sampling clocks 18 have a period T but are phase shifted in time by T/2. The analog input 12 to the system 10 is a continuous time analog input x(t) which is sampled by the sample and hold circuits 16 for the sub-ADCs 12 in a back to back manner at time instances kT and $$\left(k+\frac{1}{2}\right)T,$$

respectively, where k is an integer. The ensuing sampled waveform of the continuous time analog input x(t) by each of the sample and hold circuits 16(1) and 16(2) is shown in FIG. 4 and samples can be seen as being even (for example, designated by dots and labeled as $x_{A1}(n)$) samples and odd (for example, designated by squares and labeled as $x_{A2}(n)$) samples that are interleaved in time. The Discrete Time Fourier Transform (DTFT) of the even and odd samples from the continuous time analog input x(t) at the A1 and A2 outputs can be shown to be:

$$X_{A1}(e^{j\omega}) = \frac{1}{T}\sum_k X\left(\frac{\omega}{T} - \frac{2\pi k}{T}\right)$$

$$X_{A2}(e^{j\omega}) = \frac{1}{T}\sum_k X\left(\frac{\omega}{T} - \frac{2\pi k}{T}\right)e^{j\left(\frac{\omega}{T} - \frac{2\pi k}{T}\right)T/2}$$

The digitized ADC outputs A1 and A2 are aliased versions of the continuous time analog input signal x(t). These outputs are further up-sampled by a factor of N=2 to match the sub-ADC output rate with the rate of the TI-ADC system (Fs=2$f_s$). Post rate conversion, the ADC outputs B1 and B2 become:

$$X_{B1}(e^{j\omega}) = \frac{1}{T}\sum_k X\left(\frac{2\omega}{T} - \frac{2\pi k}{T}\right)$$

-continued $$X_{B2}(e^{j\omega}) = \frac{1}{T}\sum_k X\left(\frac{2\omega}{T} - \frac{2\pi k}{T}\right)e^{j\left(\frac{2\omega}{T} - \frac{2\pi k}{T}\right)T/2}$$

A sample delay $e^{-j\omega}$ on output B2 (provided by delay $z^{-1}$) followed by a summation of the delayed output B3 with the output B1 emulates the TI-ADC output multiplexing operation performed by the selector circuit 24. The output B3 is the delayed version of B2 with a frequency domain representation:

$$X_{B3}(e^{j\omega}) = \frac{1}{T}\sum_k X\left(\frac{2\omega}{T} - \frac{2\pi k}{T}\right)e^{-j\pi k}.$$

Figure 5:
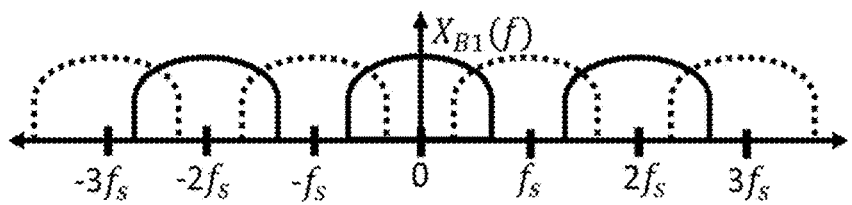
FIGS. 5-7 illustrate spectra for the signals of the model of FIG. 3.
Figure 6:
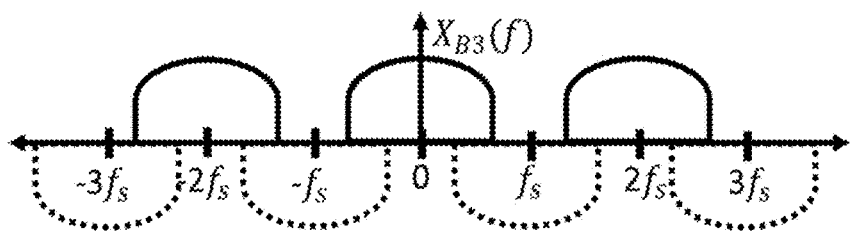
Figure 7:
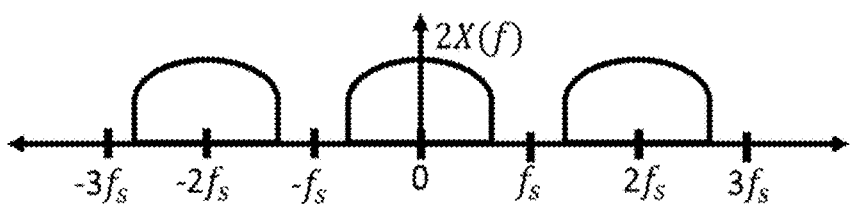

The spectra of the outputs B1 and B3, which are shown by FIGS. 5 and 6, respectively, exhibit heavy aliasing. This aliasing, however, is eventually cancelled out by the multiplexing operation performed by the selector 24. As multiplexing of discrete-time signals is equivalent to addition (see, FIG. 3 reference 30), the alias spectral copies around $\pm f_s$ cancel each other in $X_{B1}(f)+X_{B3}(f)$ thus yielding a scaled original signal 2X(f) as shown in FIG. 7. Such cancellation is akin to image rejection in RF receivers, and this highlights and emphasizes the need for a precise matching requirement of the sub-ADCs in the TI-ADC circuit.

In a TI-ADC, skew mismatches appear when the sampling instants of the sub-ADCs are not perfectly matched. For an N=2 sub-ADC implementation of the TI-ADC circuit, the second sub-ADC ideally samples exactly T/2 seconds after the first sub-ADC, which makes the overall sampling scheme uniform in time. In practice, however, technology variations or layout imperfections can reduce or increase the sampling interval between consecutive sub-ADCs.

Figure 8:
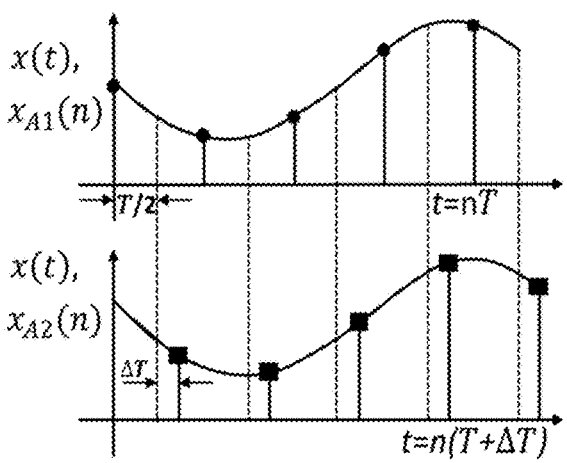
FIG. 8 illustrates the sampled waveform for the model of FIG. 3 with a timing skew mismatch.
Figure 9:
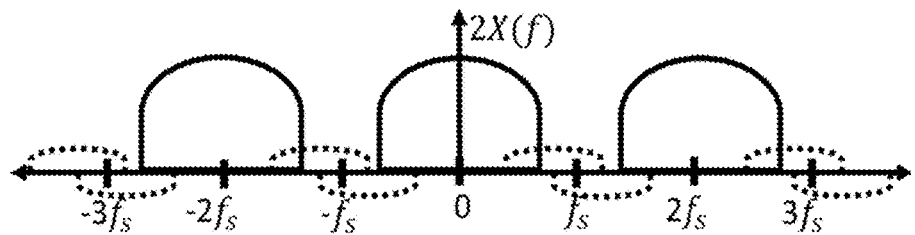
FIG. 9 shows spectra illustrating the presence of spurious images due to the timing skew mismatch.

Normally, in this example using two sub-ADCs, the sub-ADCs sample the signal at times kT and $$\left(k + \frac{1}{2}\right)T,$$

but because of the mismatches, a positive or negative sampling clock timing offset $\Delta T$ causes non-uniform sampling of the input signal x(t) as shown in FIG. 8. Consequently, for a two sub-ADC system, time-skew mismatches yield uncancelled residue aliases of the input signal spectrum around frequency multiples of $f_s/2$ which manifest as undesirable spurious artifacts at the TI-ADC system output. FIG. 8 illustrates the effect of time-skew mismatch in the time domain. FIG. 9 illustrates the effect of time-skew mismatch in the frequency domain. The key task is to eliminate the spurious images as shown in FIG. 9 which are caused by this undesired sampling clock timing offset $\Delta T$.

A time-skew mismatch calibration technique is proposed herein that performs a direct estimation of the sub-ADCs sampling clock timing offsets. This approach stands out from the state of the art techniques that often rely on statistical based estimation such as cross-correlation and autocovariance functions. The proposed time-skew calibration operates in the background, and thus is performed in parallel with the normal operations for time-interleaved ADC, while assuming that the offset and gain mismatches have already been removed by other means (such as is known to those skilled in the art).

The proposed calibration is performed in two phases: A) estimating each sub-ADC's sampling clock timing offset $\Delta T$ with respect to a reference sub-ADC, and B) correcting each sub-ADC's output signal based on the result of the estimation.

An assumption is made here that the timing offsets are small. This allows for linearizing the delay transfer function. The correction of each sub-ADC's output signal is accomplished through linear interpolation based on the timing offset estimates and the instantaneous signal derivative.

A) Estimation of the Timing Offset:

Timing skew mismatches shift positively or negatively the sub-ADC sampling times, and therefore also create a small error in the sampled value. If a sub-ADC has a small positive timing offset, the error on the sampled value is positive if the slope of the signal is locally positive. Conversely, if sub-ADC has a small negative timing offset, the error on the sampled value is negative if the slope of the signal is locally negative.

Figure 10:
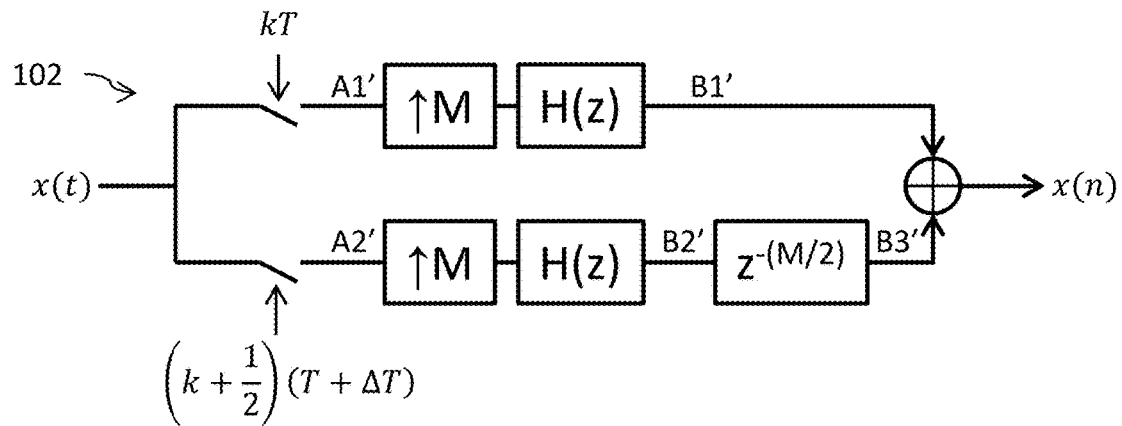
FIG. 10 shows a model of a TI-ADC circuit as shown in FIG. 1 where there exists a time skew mismatch.

Reference is made to FIG. 10 showing a model 102 of a time interleaved analog to digital converter (TI-ADC) circuit 10 as shown in FIG. 1 where N=2 and where there exists a time skew mismatch. Again, the selection of N=2 is made by way of a simplified example, but it will be understood that the following description is extendable by one skilled in the art to any suitable integer value of N. Two analog to digital converters 12 with sample and hold circuits 16 each operate at the sampling rate $f_s$. A first one of the converters 12(1) is referred to as the reference sub-ADC in a reference ADC channel, and a second one of the converters 12(2) suffers from the time skew mismatch and is referred to as another sub-ADC in another ADC channel. The sampling clocks 18 have a period T and are ideally phase shifted in time by T/2, but due to time skew mismatch the continuous time analog input x(t) 12 to the system 10 is sampled by the sample and hold circuits 16 for the sub-ADCs 12 back to back at time instances kT and $$\left(k + \frac{1}{2}\right)(T + \Delta T),$$

where k is an integer and $\Delta T$ is the sampling clock timing offset (or time skew mismatch). The ensuing sampled waveform by the sample and hold circuits is shown in FIG. 8. The Discrete Time Fourier Transform (DTFT) of the even and odd samples from the continuous time analog input x(t) at A1' and A2' can be shown to be:

$$X_{A1'}(e^{j\omega}) = \frac{1}{T}\sum_k X\left(\frac{\omega}{T} - \frac{2\pi k}{T}\right)$$

$$X_{A2'}(e^{j\omega}) = \frac{1}{T}\sum_k X\left(\frac{\omega}{T} - \frac{2\pi k}{T}\right)e^{j\left(\frac{\omega}{T} - \frac{2\pi k}{T}\right)(T+\Delta T)/2}$$

The sub-ADC sampled outputs A1' and A2' are further interpolated by a factor of M, where M is substantially greater than N (by a factor of a hundred or a thousand, for example). The interpolation operation is represented as an up-sampler followed by an image attenuating low pass filter H(z). Post interpolation, outputs B1' and B2' can be shown to be:

$$X_{B1'}(e^{j\omega}) = \frac{1}{T}\sum_k X\left(\frac{M\omega}{T} - \frac{2\pi k}{T}\right)$$

-continued $$X_{B2'}(e^{j\omega}) = \frac{1}{T}\sum_k X\left(\frac{M\omega}{T} - \frac{2\pi k}{T}\right)e^{j\left(\frac{M\omega}{T} - \frac{2\pi k}{T}\right)(T+\Delta T)/2}$$

It will be noted that post digitization, B2' suffers a misalignment of $\Delta T$ which is quantified in integral multiples of T/M. Prior to the output multiplexor, B3' results from B2' shifted by $z^{-M/2}$ samples at rate $Mf_s$ which corresponds to an absolute time shift of T/2 with respect to the reference sub-ADC:

$$X_{B3'}(e^{j\omega}) = \frac{1}{T}\sum_k [X\left(\frac{M\omega}{T} - \frac{2\pi k}{T}\right)e^{-j\pi k}]e^{j\left(\frac{M\omega}{T} - \frac{2\pi k}{T}\right)\Delta T/2}$$

The foregoing equation contains an undesired phase shift error $$e^{j\left(\frac{M\omega}{T} - \frac{2\pi k}{T}\right)\Delta T/2}$$

term that occurs due to the sampling clock timing offset (time skew mismatch) $\Delta T$ in the second sub-ADC 12(2) causing a non-uniform sampled output at the TI-ADC system.

In order to calculate the undesired time shift error $\Delta T$, the phase shift error is evaluated at k=0 to obtain $$e^{j\omega\left(\frac{M\Delta T}{2T}\right)}$$

which essentially is a p sample delay at rate $Mf_s$:

$$\Delta T = p\left(\frac{T}{M}\right)$$

Figure 11:
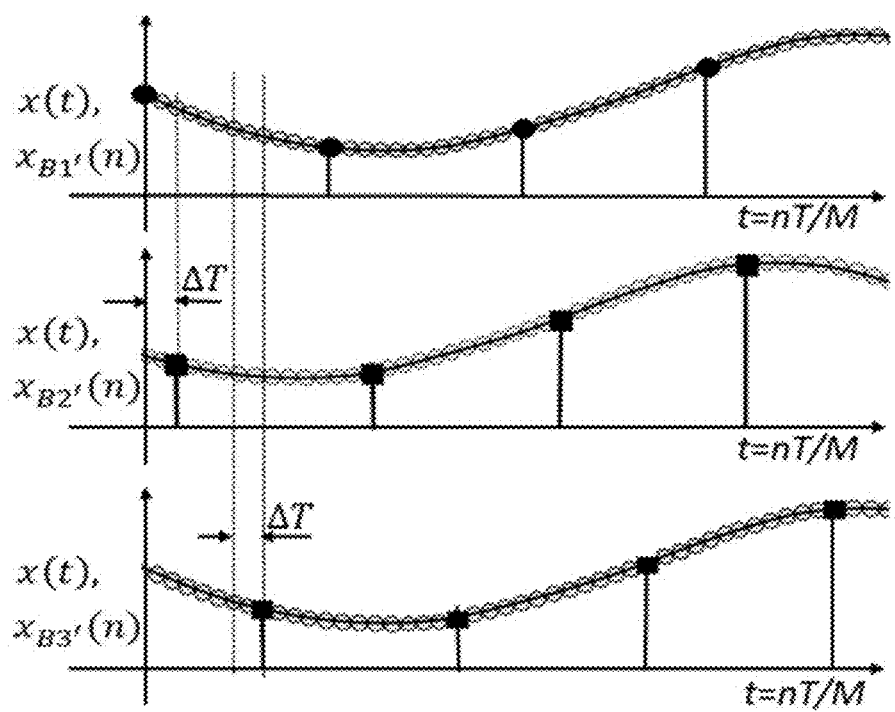
FIG. 11 illustrates the time skew error in terms of the number of interpolated samples.

From the foregoing equation, the time shift error $\Delta T$ can be quantified as an integral multiple of T/M. Therefore, by choosing M to be sufficiently large, $\Delta T$ can be estimated very accurately. FIG. 11 illustrates the sampling clock timing offset $\Delta T$ at B2' and B3' with respect to B1' in terms of the number of interpolated samples (referred to herein as p).

The foregoing analysis demonstrates that interpolated samples from the sub-ADCs can be used to compute the sampling clock timing offset (time skew mismatch) $\Delta T$ accurately with high precision. In a digital circuit, computation resources are limited, and it is desired that the implementation of this estimation operation be optimized in hardware. If the value for M is kept large, then heavy filtering would be required for achieving high interpolation ratios. To address this concern, a polyphase interpolation process is implemented by the estimator.

Figure 12:
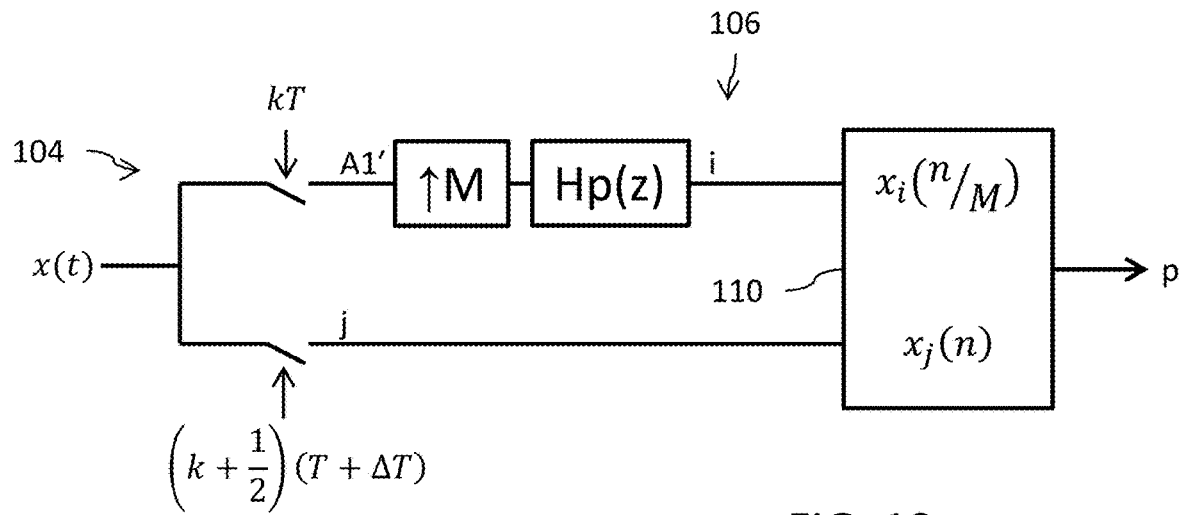
FIG. 12 shows a model of a TI-ADC circuit as shown in FIG. 1 and includes an estimator configured to estimate a time skew mismatch error.

Reference is made to FIG. 12 showing a model 104 of a time interleaved analog to digital converter (TI-ADC) circuit 10 as shown in FIG. 1 where N=2 and further including an estimator 106 configured to estimate the sampling clock timing offset $\Delta T$. Again, the selection of N=2 is made by way of a simplified example, but it will be understood that the following description is extendable by one skilled in the art to any suitable integer value of N. The output of the reference sub-ADC 12(1) is interpolated by a factor of M (where M may, for example, have a value of 5,000). The interpolation operation is represented as an up-sampler followed by a low pass filtering operation using polyphase interpolation filter banks $H_p(z)$. Multiple $x_i$ samples at rate $Mf_s$ from the polyphase interpolation filter banks $H_p(z)$ are then continuously compared with $x_j$ samples from the second sub-AC 12(2) using a comparator circuit 110 to deduce p which represents a number of interpolated samples between the $x_i$ sample at time T/2 and the $x_i$ sample at time T/2+$\Delta T$ whose value substantially matches the value of the $x_j$ sample from the second sub-AC 12(2) taken at time T/2+$\Delta T$ (see, FIG. 13). More specifically, the comparator circuit 110 processes the interpolated $x_i$ samples generated from the polyphase interpolation filter banks $H_p(z)$ to identify which one of those interpolated samples most closely matches the $x_j$ sample from the second sub-AC 12(2). The number of samples between that identified sample and the sample at time T/2 is indicative of the timing skew mismatch $\Delta T$.

Figure 13:
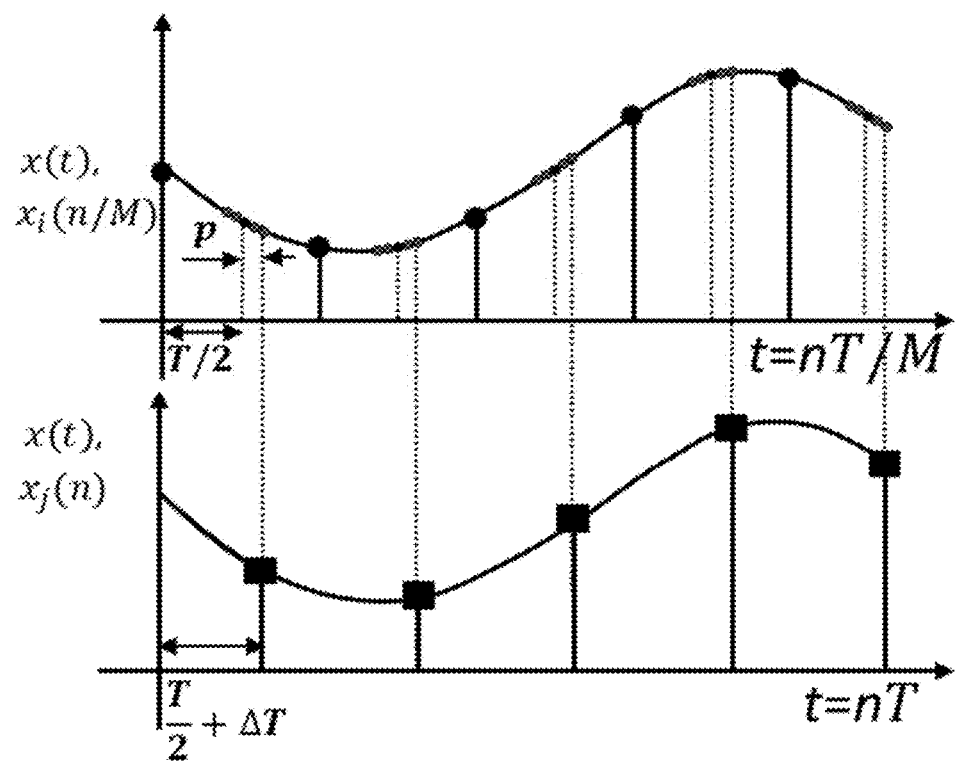
FIG. 13 illustrates interpolated sample relationship with the time skew mismatch.

It will be noted that the sampling clock timing offset (timing skew mismatch) $\Delta T$ is small and typically a small fraction of the sample clock time period T. It can thus be safely stated, as shown in FIG. 13, that interpolated samples in near proximity of the interpolated sample $x_i(n/2)$ which is at time T/2 shifted from the reference sub-ADC 12(1) would suffice to quantify the timing skew mismatch $\Delta T$ of the sample $x_j(n)$ which is at time T/2+$\Delta T$ shifted from the second sub-ADC 12(2). This assumption/observation aids in designing the polyphase interpolation banks $H_p(z)$ so that not all M polyphase filter banks are needed, but rather only a small subset of the banks are used. For an r tap FIR interpolating filter, there exist a total of M polyphase filter banks with each bank comprising $$\frac{r}{M}$$

coefficients. It is proposed to limit the number of polyphase filter banks to 2m+1 (with 2m<<M), where m depends on the system's maximum time-skew specification. For example, if time period of TI-ADC clock T=1 ns (nano second) with expected maximum time-skew $\Delta T_{max}$=500 fs (femto second) and required correction resolution for $\Delta T$ is 100 fs, then M=10000 and m=5. This is because the maximum deviation of $\Delta T_{max}$ will be ±500 fs from the ideal sample, and the best case correction requirement is within 100 fs. So m=500/100. Thus, there is no need to implement all 10000 polyphase filter banks (M), but rather only 11 polyphase filter banks (2m+1) need to be implemented. For the dual TI-ADC under discussion as an example, the polyphase banks can be derived from the matrix operation illustrated in FIG. 14.

It is advantageous that $H_p(z)$ is a small subset of the M possible polyphase filter banks. FIG. 15 illustrates an example three bank $H_p(z)$ implementation for m=1. It is to be noted that the native output rate of an interpolate by M filter is $Mf_s$, and this implies that the filter generates M outputs per input x(n). Now, because of reduced polyphase bank realizations in the proposed implementation, the number of output samples per interpolation cycle is only 2m+1, thus reducing the estimator computation burden significantly.

B) Correction of the Timing Offset:

Once the sampling clock timing offset $\Delta T$ has been accurately estimated, it is used at the TI-ADC system output to correct the time-skewed sample values from the second sub-ADC 12(2). FIG. 16 illustrates a zoomed section of the erroneous TI-ADC output $y_e(n)$ with error $\epsilon$ described by a first order error model:

$$\epsilon = \Delta T \frac{dy_e}{dt}$$

If the delay $\Delta T$ is sufficiently small, the original sample can be recovered from the skewed sample by following the tangent of the signal around the sample to be corrected (linear interpolation). The instantaneous error $\epsilon$ can be extracted and subsequently be corrected by a simple calculation for every other sample output of the TI-ADC. In other words, the original sample $y(n)$ can be recovered from the delayed sample $y_e(n)$ by adding it to an error term E described earlier:

$$y(n) = y_e(n) + \Delta T \frac{dy_e}{dt}$$

The derived reconstruction of the foregoing equation requires knowledge about the signal derivative. The first order signal derivative on any point of the signal is a tangent at that point. It is proposed to use a high rate interpolation filter at the TI-ADC output to compute an adjacent point in the nearest neighborhood of the output samples. This adjacent point is used along with the original sample to evaluate the slope at that instant. As explained in above discussion of A) Estimation of the timing offset, selective polyphase banks can be deployed to compute partial interpolation values as per requirements. The present need for a single sample derivative mandates only a single polyphase bank implementation which is used to compute the neighboring sample. For an r' tap FIR interpolate by M' filter, these coefficients are shown in FIG. 18.

It follows that a single polyphase bank filter $H_d(z)$ is sufficient to compute the instantaneous gradient of any point at the TI-ADC output $y_e[n]$. Although, the slope computation occurs at full output rate, computation requirements are greatly relaxed and limited to implementing a single polyphase filter bank. FIG. 17 illustrates the slope evaluation at the output rate $2M'f_s$ using $y_e[n]$ and the calculated interpolated value $$y_e[n + \frac{n}{M'}].$$

The instantaneous slope is given by:

$$\frac{dy_e}{dt} = y_e\left[n + \frac{n}{M'}\right] - y_e[n]$$

The proposed correction technique effectively computes the instantaneous slope and uses it to correct the amplitude error in each sample. All this is easily implementable in real time with minimal hardware resources.

Evaluation

In order to verify the effectiveness of the proposed estimation and correction technique described above, a dual TI-ADC system with a timing skew mismatch is implemented in MATLAB. A full-scale 12-bit multi-tone signal with an integrated noise of −60 dB till Nyquist is used to evaluate the performance of the proposed technique. The multi-tone signal is sampled at 1 GHz by the TI-ADC system and a timing skew mismatch of 1 pS is introduced in one of the sub-ADCs. The uncorrected output spectrum is illustrated in FIG. 19. The presence of unwanted in-band spurs limits the system SFDR (Spurious Free Dynamic Range) to −55.8 dB. Next, the proposed estimation and correction methods are applied to the impaired input samples. FIG. 20 shows the spectrum of the TI-ADC using the proposed calibration technique for 5,000 sampling clock cycles. The alias image spurs are greatly reduced to −70.1 dB, which presents an improvement of over 15 dB. The proposed calibration method is thus shown to be able to rapidly track and correct sub-pico second time-skew delays and significantly improve TI-ADC performance.

Implementation

Figure 21:
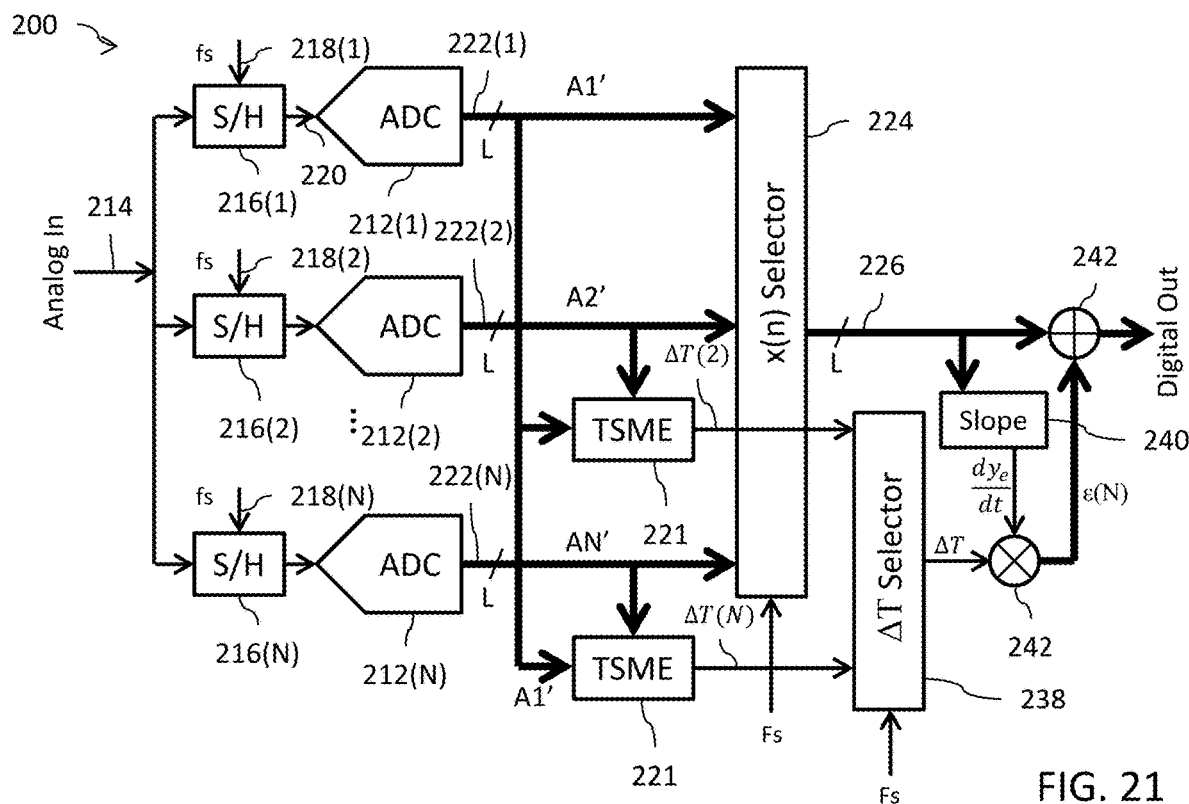
FIG. 21 is a block diagram of a TI-ADC circuit with time skew mismatch error correction functionality.

FIG. 21 shows a block diagram of a time interleaved analog to digital converter (TI-ADC) circuit 200. The circuit 200 includes N analog to digital (ADC) converters 212(1)-212(N) (also referred to in the art as sub-ADCs). The analog input signal 214 to be converted to the digital domain is applied to N sample and hold (S/H) circuits 216(1)-216(N). Each sample and hold circuit 216 receives a corresponding sampling clock 218(1)-218(N), and the sampling clocks 218 have a sampling frequency of $f_s$. Each ADC converter 212 operates to convert the sampled analog signal 220 produced by the S/H circuit 216 to generate an L-bit digital signal 222. A selector circuit 224, also referred to in the art as a multiplexor, operating at the rate Fs (where: $Fs=N*f_s$) sequentially selects samples of the M-bit digital signals 222(1)-222(N) for interleaving to generate a cumulative digital output signal 226.

While the sampling clocks 218(1)-218(N) are ideally uniformly phase offset from each other across a clock period T; for example, with a phase offset of T/N, in reality there is likely to be a time skew mismatch. In this context, the sampling clock 218(1) for the reference ADC channel including S/H circuit 216(1) and ADC converter 212(1) is considered as the reference from which the time skew mismatches for the other sampling clocks 218(2)-218(N) are determined. The sampling clock 218(1) causes sampling of the input by the reference ADC channel to occur at specified instances, while the sampling clock 218(N) causes sampling of the input by the Nth ADC channel to occur at phase shifted instances with a $\Delta T$ time skew mismatch. A time skew mismatch error (TSME) determination circuit 221 is provided for each of the ADC channels other than the reference ADC channel. Each TSME determination circuit receives the output (A1') of the ADC converter 212(1) for the reference ADC channel as well as the output (A(_)') of the ADC converter 212 for the particular ADC channel having the time skew mismatch of its sampling clock 218. The TSME determination circuit 221 performs the process A) described herein for making an estimation of the timing offset $\Delta T(\_)$.

The timing offset results $\Delta T(\_)$ for each ADC channel (other than the reference channel) are input to a selector circuit 238, also referred to in the art as a multiplexor, operating at the rate Fs (where: $Fs=N*f_s$) which sequentially selects the timing offset $\Delta T(\_)$ in correspondence with its M-bit digital signal 222(_). The process B) described herein for calculating the error term E is performed using circuitry which processes the cumulative digital output signal 226 using a slope extraction circuit 240 to obtain the derivative $$\frac{dy_e}{dt}.$$

The slope circuit implements a single polyphase bank filter $H_d(z)$ to compute the instantaneous gradient of any point at the TI-ADC output A(_)' 222 (signal $y_e[n]$) within the cumulative digital output signal 226.

With knowledge of the instantaneous slope $$\frac{dy_e}{dt}$$

and the time shift error $\Delta T$, an error term $\epsilon(N)$ which can correct the time-skewed sample values from the sub-ADC 212(N) is determined using a multiplication circuit 242 as follows:

$$\epsilon(N) = \Delta T \frac{dy_e}{dt}$$

A summation circuit 244 then adds the error term $\epsilon(N)$ to the corresponding time-skewed sample value (i.e., the TI-ADC output A(_)' 222 from the sub-ADC 212(N)) for correcting the error in the generated digital output signal.

Figure 22:
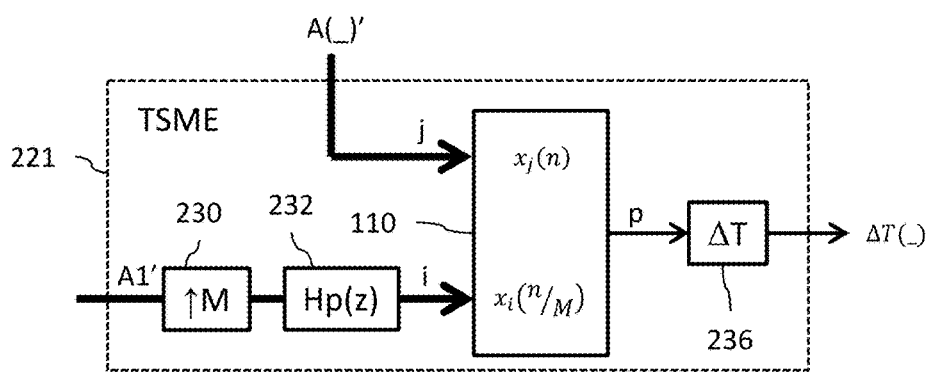
FIG. 22 is a block diagram of a time skew mismatch error (TSME) determination circuit of the TI-ADC circuit of FIG. 21.

Reference is now made to FIG. 22 which shows a block diagram for the TSME determination circuit 221. The output A1' of the ADC converter 212(1) for the reference ADC channel is interpolated using an upsampling by M (reference 230) followed by a filtering (reference 232) using polyphase interpolation filter banks $H_p(z)$ to produce the $x_i$ samples. Multiple $x_i$ samples at rate $Mf_s$ from the polyphase interpolation filter banks $H_p(z)$ are then continuously compared (reference 110) with an $x_j$ sample for the output A(_)', signal 222, from the non-reference sub-AC 212(_) using a comparator circuit 110 to deduce p which provides the number of interpolated samples indicated of the time offset. The polyphase filter $H_p(z)$ is tuned to include only a small subset of the M possible interpolation filter banks such that filtering is made so as to only produce the 2m+1 $x_i$ samples which are in the neighborhood of the sample $x_i(n/2)$ (T/2 time shifted). As the period T of the clock is known and further as the interpolation value M is known, the estimation of the time shift error $\Delta T$ for the sampling clock 218(N) is then calculated by an error estimation circuit 236 from the value p using the equation:

$$\Delta T = p\left(\frac{T}{M}\right)$$

The all-digital background calibration technique disclosed herein for time-skew mismatch correction in TI-ADCs presents a number of advantages over prior art solutions: a) the non-iterative technique is not based on any contemporary statistical approaches and converges very rapidly; b) the technique is independent of the nature of the input signal and places no constraints on the input signal bandwidth; c) the technique is very effective method in estimating a wide range of timing offsets using low hardware resources; d) the first order linear model for correction works well for small time-skews and may be better approximated for larger skews; d) the calibration method can easily be extended to any channel TI-ADC system; and e) the process is performed in real time to make the correction.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A time-interleaved analog to digital converter (TI-ADC), comprising:
    a first sub-ADC configured to sample and convert an input analog signal to generate a first digital signal;
    a second sub-ADC configured to sample and convert said input analog signal to generate a second digital signal, wherein sampling by said second sub-ADC occurs with a time skew mismatch;
    a multiplexor configured to interleave the first and second digital signals to generate a third digital signal;
    a processing circuit configured to generate from the first and second digital signals an error signal that estimates an error due to said time skew mismatch; and
    a summation circuit configured to sum the error signal with the third digital signal to generate a digital output signal.

2. The TI-ADC of claim 1, wherein the processing circuit is configured to determine a slope value of said third digital signal and generate said error signal from the slope value.

3. The TI-ADC of claim 2, wherein the processing circuit comprises:
    a time skew mismatch error (TSME) determination circuit configured to process the first and second digital signals to generate a time error corresponding to said time skew mismatch; and
    a multiplication circuit configured to multiply the time error by the slope value to generate said error signal.

4. The TI-ADC of claim 1, wherein the first and second sub-ADCs each sample at a sub-sample rate of a converter sample rate, but sample with a phase offset that is a function of a number of sub-ADCs which are included in the TI-ADC.

5. The TI-ADC of claim 4, wherein the multiplexor interleaves the first and second digital signals at the converter sample rate.

6. The TI-ADC of claim 1, wherein the processing circuit comprises:
    an interpolation circuit configured to generate a plurality of interpolated samples from the first digital signal;
    a comparison circuit configured to compare the plurality of interpolated samples to the second digital signal and identify certain interpolated samples of said plurality of interpolated samples closest to the second digital signal; and
    a conversion circuit configured to generate a time error corresponding to said time skew mismatch from said identified certain interpolated samples.

7. The TI-ADC of claim 6, wherein the interpolation circuit comprises:
    an upsampling circuit configured to upsample the first digital signal; and
    a filtering circuit configured to filter the upsampled the first digital signal to generate the plurality of interpolated samples.

8. The TI-ADC of claim 7, wherein the filtering circuit is a polyphase circuit, and wherein the polyphase circuit is configured to generate the plurality of interpolated samples to include a limited number of interpolated samples located around a time of the second digital signal.

9. The TI-ADC of claim 8, wherein the limited number is substantially smaller than a rate of the upsampling.

10. The TI-ADC of claim 6, further comprising a multiplication circuit configured to multiply the time error by a slope value of said third digital signal to generate said error signal.

11. The TI-ADC of claim 1, wherein the error signal provides a first order estimation of the error in the second digital signal due to the time skew mismatch.

12. A method for time-interleaved analog to digital conversion, comprising:
sampling and converting an input analog signal to generate a first digital signal;
sampling and converting said input analog signal to generate a second digital signal, wherein sampling by said second sub-ADC occurs with a time skew mismatch;
interleaved selecting of the first and second digital signals to generate a third digital signal;
processing the first and second digital signals to generate an error signal that estimates an error due to the time skew mismatch; and
summing the error signal with the third digital signal to generate a digital output signal.

13. The method of claim 12, wherein processing comprises:
determining a slope value of said third digital signal; and
generating said error signal from the slope value.

14. The method of claim 13, wherein generating comprises:
processing the first and second digital signals to generate a time error corresponding to said time skew mismatch; and
multiplying the time error by the slope value to generate said error signal.

15. The method of claim 12, further comprising:
generating a plurality of interpolated samples from the first digital signal;
comparing the plurality of interpolated samples to the second digital signal;
identifying certain interpolated samples of said plurality of interpolated samples closest to the second digital signal; and
generating a time error corresponding to said time skew mismatch from said identified number of interpolated samples.

16. The method of claim 15, wherein generating the plurality of interpolated samples comprises:
upsampling the first digital signal; and
filtering the upsampled the first digital signal to generate the plurality of interpolated samples.

17. The method of claim 16, wherein filtering comprises performing a polyphase filtering to generate the plurality of interpolated samples to include a limited number of interpolated samples located around the time of the second digital signal.

18. The method of claim 17, wherein the limited number is substantially smaller than a rate of the upsampling.

19. The method of claim 15, further comprising a multiplication circuit configured to multiply the time error by a slope value of said third digital signal to generate said error signal.

20. The method of claim 12, wherein sampling of the input signal to produce the first and second digital signals occurs with a phase offset.

21. The method of claim 12, wherein interleaved selecting is made at a rate of the sampling.

22. The method of claim 12, wherein the error signal provides a first order estimation of the error in the second digital signal due to the time skew mismatch.

* * * * *